(12) United States Patent
Spiegel

(10) Patent No.: US 6,664,844 B1
(45) Date of Patent: Dec. 16, 2003

(54) TEMPERATURE COMPENSATION IN ELECTRONIC DEVICES

(75) Inventor: Egbert Spiegel, Gelsenkirchen (DE)

(73) Assignee: Nokia Corporation, Espoo (FI)

(*) Notice: Subject to any disclaimer, the term of this patent is extended or adjusted under 35 U.S.C. 154(b) by 0 days.

(21) Appl. No.: 09/522,700

(22) Filed: Mar. 10, 2000

Related U.S. Application Data

(63) Continuation of application No. PCT/FI98/00736, filed on Sep. 18, 1998.

(30) Foreign Application Priority Data

Sep. 19, 1997 (FI) .................................................. 973731

(51) Int. Cl.⁷ ............................................. H01L 35/00
(52) U.S. Cl. ........................................ 327/513; 327/378
(58) Field of Search ................................. 327/378, 512, 327/513, 538–541, 543

(56) References Cited

U.S. PATENT DOCUMENTS

| | | | |
|---|---|---|---|
| 4,037,399 A | 7/1977 | Chihara | 368/202 |
| 4,717,836 A | 1/1988 | Doyle | 326/71 |
| 5,399,960 A * | 3/1995 | Gross | 327/513 |
| 5,686,825 A * | 11/1997 | Suh et al. | 327/512 |
| 5,796,280 A * | 8/1998 | Tuozzolo | 327/512 |
| 5,801,584 A * | 9/1998 | Mori | 327/513 |

FOREIGN PATENT DOCUMENTS

| | | |
|---|---|---|
| JP | 59-14005 | 8/1985 |
| JP | 59-238340 | 6/1986 |
| JP | 63-39962 | 8/1989 |
| JP | 3-60401 | 10/1992 |

* cited by examiner

Primary Examiner—Kenneth B. Wells
(74) Attorney, Agent, or Firm—Squire, Sanders & Dempsey L.L.P.

(57) ABSTRACT

The invention relates to a method for temperature compensation in an electric circuit. In order to get rid of costly manufacturing processes and external components, a PTAT resistor is replaced by a series connection of two resistive elements (Rx, 31), the first of said elements (Rx) having essentially constant resistance regardless of the temperature, and the second element (31) having a resistance which is non-linearly dependent on the temperature. The resistance value of the first element is selected so that an approximation of the resistance of said series connection is directly proportional to the temperature.

9 Claims, 1 Drawing Sheet

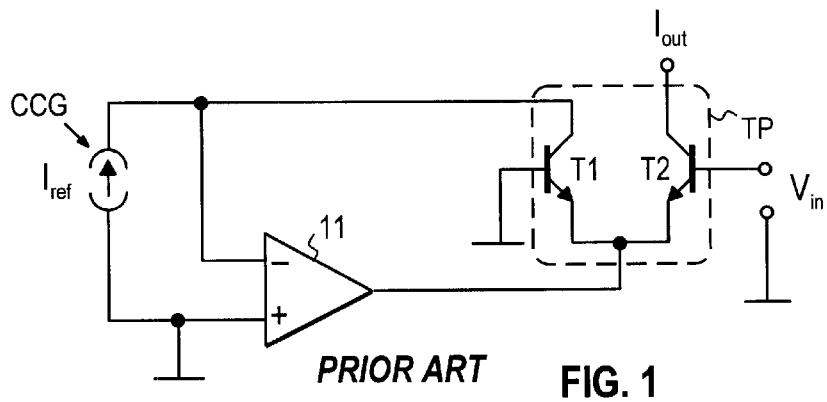
PRIOR ART FIG. 1
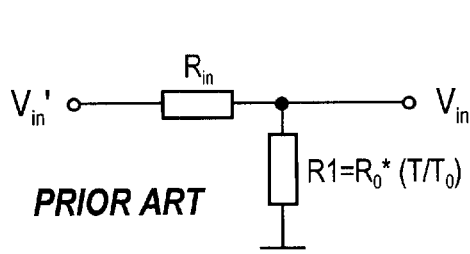
PRIOR ART FIG. 2
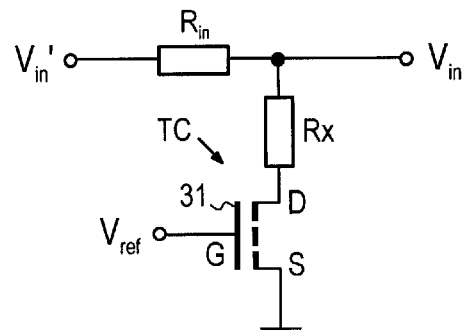
FIG. 3
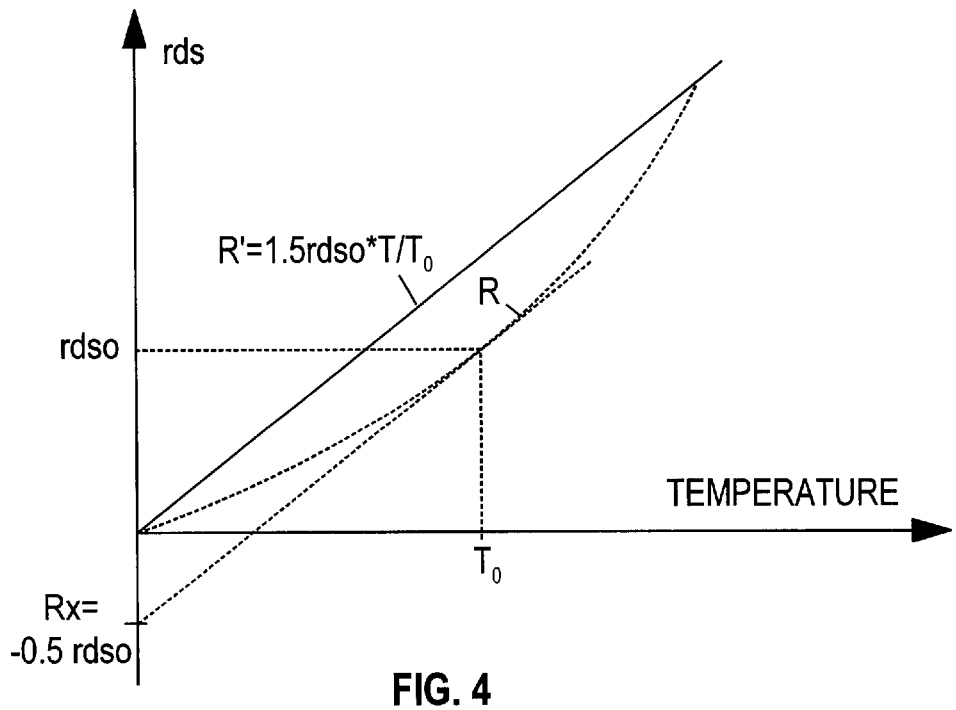
FIG. 4

TEMPERATURE COMPENSATION IN ELECTRONIC DEVICES

This application is a continuation of application Ser. No. PCT/FI98/00736 filed Sep. 18, 1998.

FIELD OF THE INVENTION

This invention relates to temperature compensation in electronic devices, especially in devices including integrated circuits.

Background of the Invention

As described later, the solution according to the present invention is suitable for various different circuit applications in which the effect of temperature fluctuations must be compensated for. One possible object of application is a function generator which can be used in a radio transceiver, for example. A function generator is thus used as an example in the following description.

The main problem of an exponential (or logarithmic) function generator is its temperature stability. A conventional way of compensating for the voltage or current changes caused by temperature fluctuations is to use resistors proportional to the absolute temperature value of the environment, so-called PTAT resistors. This type of resistor is commercially available as a discrete component from different manufacturers.

The use of these discrete components in association with integrated circuits has some drawbacks, however, which are described briefly in the following.

Firstly, such an external resistor increases the costs of the circuit: a discrete PTAT resistor is an expensive component as such, and since its mounting on the circuit board requires time, this also means additional cost. The costs are further increased by the fact that material management becomes more complicated as the external components must be available in stock. Secondly, an external PTAT resistor decreases the reliability of the circuit, i.e. the external resistor shortens the MTTF value (Mean Time To Failure) of the circuit. Thirdly, an external PTAT resistor makes the associated circuit more sensitive to interferences.

Moreover, implementing the temperature compensation with high accuracy is difficult and requires a complicated circuit. This is because the temperature of an external PTAT resistor can be different from that of the chip containing the circuit whose temperature behaviour the resistor controls. Therefore, accurate compensation requires that a temperature measurement be introduced into the circuitry.

The above drawbacks can at least partially be eliminated by integrating the PTAT resistors into the chips. However, this kind of integration requires additional process steps which are non-standard and available only from a small amount of vendors. Thus, such a solution involves high costs which in turn hinder application of this integration to low cost or consumer products, for example. Further, the additional process steps used are vendor-specific. This means that if the same circuit is later ordered from another vendor, certain process steps must be done again. The more complicated the manufacturing process is, the more the vendor-specific processes differ from each other.

SUMMARY OF THE INVENTION

The purpose of the invention is to diminish the above-mentioned drawbacks and to create a solution by means of which it is possible to perform the temperature compensation in an integrated circuit device without having to resort to costly manufacturing processes.

This goal can be attained by using the solution defined in the independent patent claims.

The basic idea of the invention is to replace a PTAT resistor used for temperature compensation by a series connection of an ordinary resistor and a resistive element with non-linear temperature characteristics, preferably a (MOS)FET. Owing to this, the temperature compensation can easily be integrated into a chip using standard manufacturing processes. Thus, according to the invention a temperature dependent resistive element is simulated by a series connection of an ordinary resistor and, a resistive element with non-linear temperature characteristics. ("Ordinary" here refers to an element with essentially constant resistance regardless of the temperature value.)

The invention offers an inexpensive solution for temperature compensation in electronic devices. This is because neither the special IC manufacturing nor the external components mentioned above are needed. Consequently, the solution according to the invention is particularly advantageous in high volume/low cost applications (i.e. for example in end-user applications, such as mobile phones).

BRIEF DESCRIPTION OF THE DRAWINGS

In the following, the invention and its preferred embodiments are described in closer detail with reference to examples shown in the appended drawings, wherein FIG. 1 illustrates a known exponential function generator, FIG. 2 illustrates a known temperature compensation circuit for an exponential function generator, FIG. 3 illustrates a temperature compensation circuit according to the present invention for an exponential function generator, and FIG. 4 illustrates the temperature compensation according to the present invention graphically.

DETAILED DESCRIPTION OF THE INVENTION

As mentioned above, when putting the idea of the invention into practice, one preferable area of application is an exponential function generator used in AGC amplifiers of radio transceivers, for example. Therefore, the prior art and the invention are described below in more detail in terms of an exponential function generator.

If an AGC amplifier of a radio transmitter/receiver is to be implemented so that a linear relationship is established between the control voltage of the AGC amplifier and a gain in decibels of the amplifier, an exponential function generator is needed in the circuitry for generating current for the amplifier stage.

FIG. 1 illustrates the well-known principle of an exponential function generator. The function generator comprises a constant current generator CCG supplying a reference current $I_{ref}$, a differential amplifier 11, and transistor pair TP including two (bipolar) transistors T1 and T2. The common emitter electrode of the transistors is connected to the output of the amplifier. The base of transistor T1 is connected to the ground, whereas the base of transistor T2 serves as an input to which an input voltage $V_{in}$ is connected. The collector of transistor T2 forms the generator output supplying an output current $I_{out}$. This current is connected as a bias current to the AGC amplifier stage (not shown in the Figures). The amplifier stage can, for example, be implemented by means of a Gilbert cell, a standard circuit used commonly in AGC amplifiers and in mixers.

As known, the transfer characteristics of an exponential function generator are given as follows:

$$I_{out} = I_{ref} e^{\frac{V_{in}}{V_{th}}} \quad (1)$$

where $I_{out}$ is the output current, i.e. the bias current supplied to the amplifier stage, $V_{in}$ is the input voltage and $V_{th}$ is the thermal voltage given by $V_{th}=T\times(k/q)$, where T is the absolute temperature, k is the Boatman constant, and q is an elementary charge (unit charge).

As can be seen from equation (1), the output current is exponentially temperature dependent. If this dependence is transferred to a decibel scale (gain presented in decibels), the output current is linearly dependent on the absolute temperature.

Previously the temperature dependence has been eliminated from equation (1) by supplying the input voltage $V_{in}$ to the function generator by means of a simple voltage divider shown in FIG. 2. The voltage divider comprises two resistors which have been marked with reference marks $R_{in}$ and R1. Resistor R1 is a temperature dependent resistor (i.e. a PTAT resistor) whose resistance value is given by $R1=R_0\times(T/T_0)$, where $R_0$ and $T_0$ are constants.

Using the above value of R1, the input voltage $V_{in}$ is thus calculated:

$$V_{in} = \frac{R_0 \frac{T}{T_0}}{R_{in} + R_0 \frac{T}{T_0}} V_{in'} \approx \frac{R_0}{R_{in}} \times \frac{T}{T_0} V_{in'}; R_{in} >> R_0 \quad (2)$$

As can be seen from equations (1) and (2), the temperature compensation functions properly if the value of $R_{in}$ is at least ten times larger than the value of $R_0$. In practice this prerequisite is always fulfilled.

As described above, the temperature dependent resistor can be integrated into the chip by using additional process steps at higher costs. The manufacturing costs can be considerably reduced, however, if the temperature behaviour of a FET (field-effect transistor) is used for the compensation, whereby a commonly used BICMOS manufacturing process, for example, can be used for the integration (BICMOS=BIpolar+CMOS, i.e. a CMOS process to which bipolar transistors have been added.).

This type of compensation means that the above-described temperature dependent resistor is replaced by a series connection of a FET, preferably a MOSFET, and a conventional resistor.

This solution is illustrated in FIG. 3 which shows a voltage divider similar to that of FIG. 2, except that in this case the temperature dependent resistor R1 of FIG. 2 has been replaced by said series connection which has been marked with reference mark TC. The series connection comprises a FET, preferably a MOSFET 31 and a resistor Rx. The source electrode of the MOSFET is connected to the ground, and the drain electrode to the first pole of resistor Rx. A reference voltage $V_{ref}$ is supplied to the gate electrode of the MOSFET. The second pole of resistor Rx is connected to the pole serving as the input pole of the voltage divider.

As commonly known, the resistance of the resistor-MOSFET combination when the MOSFET is used in triode-region can be given as follows:

$$R = Rx + \frac{1}{\frac{W}{L}\beta_0 \left(\frac{T}{T_0}\right)^{-1.5}(V_{gs}-V_{t0}-V_{ds})} = \quad (3)$$

$$R_x + rdso\left(\frac{T}{T_0}\right)^{1.5} \text{ where } rdso = \frac{1}{\frac{W}{L}\beta_0(V_{gs}-V_{t0}-V_{ds})}$$

is the drain-source resistance (i.e. the channel resistance) of the transistor, W is the width of the transistor, L is the length of the transistor, $\beta_0$ is the transconductance parameter (given by the manufacturer), $V_{t0}$ is the threshold voltage, $T_0$ is the nominal temperature, T is the absolute temperature, $V_{gs}$ is the gate-source voltage, and $V_{ds}$ is the drain-source voltage of the transistor. The threshold voltage is the minimum gate-source voltage required to open the transistor. In the triode region $V_{ds}<<(V_{gs}-V_{t0})$.

The effect of the threshold voltage $V_{t0}$ on R can be minimized by using a high gate-source voltage, i.e. the a high gate-source voltage makes rdso less dependent on the manufacturing process. In practice the gate-source voltage can be of the order of one volt. Further, the drain-source voltage has to be minimized in order to reduce linearity errors in the drain-source resistance, i.e. in the gain of the amplifier.

Approximating the right hand side of equation (3) by means of the known Taylor series, we get equation (4) for R:

$$R = Rx - \frac{1}{2}rdso + \frac{3}{2}rdso\frac{T}{T_0} + \ldots \quad (4)$$

To achieve the right characteristics for the compensation, the value of Rx should be chosen so that the first two terms on the right hand side of equation (4) are eliminated. By doing so, we get:

$$Rx = \frac{1}{2}rdso. \quad (5)$$

By selecting the value of Rx according to equation (5), the value of R can be written:

$$R \approx \frac{3}{2}rdso\frac{T}{T_0}. \quad (6)$$

FIG. 4 is a graphical representation of this relationship, i.e. a graphical representation of the temperature compensation. In the figure, curve R shows the relationship according to equation (4), whereas curve R' shows its approximation according to equation (6).

As shown above, a series connection of an ordinary resistor and a (MOS)FET can be used for temperature compensation in the same way as a temperature dependent resistor.

When the above-described temperature compensation is used in an exponential function generator, it is advantageous to implement the transistors T1 and T2 (FIG. 1) of the generator as MOSFETs which operate in bipolar mode (weak inversion). (A MOSFET functions like a bipolar transistor if it is driven with a very low voltage.) In this way it is possible to manufacture the function generator by means of a pure CMOS process, the most inexpensive process available.

Although the invention has been described here in connection with the examples shown in the attached figures, it is clear that it is not limited to these examples, as it can be varied in several ways within the limits set by the attached patent claims. The following describes briefly some possible variations.

In the above described example, the PTAT resistor was replaced by a series connection of an ordinary resistor and a MOSFET, i.e. a MOSFET was used as an example of a resistive element with non-linear temperature characteristics. It is, however, to be noted that a series connection of a compensating resistor Rx and any resistive element with non-linear temperature characteristics can be used in the above-described manner to approximate the temperature characteristics of a PTAT resistor. The only restriction is that the value of the compensating resistor Rx cannot be negative.

Therefore, the idea can also be applied to any other FET type that satisfies the above-described characteristics, for example, to a JFET. It is also clear that instead of a series connection of a resistor and a FET a FET can be used alone, provided its internal resistance is high enough for the above-described elimination of terms, i.e. if it can have an internal resistance corresponding to half of its drainsource resistance. The types of circuits or devices in which the compensating series connection is used may also vary in many ways.

Thus, to sum up, it can be stated generally that the idea of the invention can be applied to any element or combination of elements that satisfies the above-described characteristics, i.e. to any element or combination of elements in which the resistance value of part of the element or of the combination can be chosen so that the total resistance of the element/combination is, at least in the first approximation, proportional to the value of prevailing temperature. This element or combination of elements can then be utilized in any electric circuits where a temperature dependent resistor can be used for temperature compensation.

Although it is preferable to integrate the compensating series connection into a chip, the solution is not restricted to integrated circuits, but the series connection can also be implemented by means of discrete components. However, in that case some of the above-mentioned benefits are lost.

What is claimed is:

1. A method of providing temperature compensation in an electric circuit comprising a first element having a cumulative resistance value substantially equal to a sum of resistance value components, a first resistance value component of the resistance value components being independent of temperature and a second resistance value component of the resistance value components being directly proportional to temperature and the first element and a second element being connected in series, the method comprising the step of:

setting the resistance value of a the second element to thereby eliminate the first resistance value component of the first element.

2. The method of claim 1, wherein the second element includes a resistive element and the first element includes a field-effect transistor.

3. The method of claim 2, wherein the resistance value of the resistive element is substantially half of the drain-source resistance of the field-effect transistor.

4. The method of claim 2, further comprising applying a reference voltage to a gate electrode of the field-effect transistor, the reference voltage being of the order of one volt.

5. The method of claim 2, wherein the field-effect transistor is a bipolar field-effect transistor.

6. An electric circuit used to compensate for temperature dependence, comprising:

a first element having a first resistance substantially equal to a sum of resistance value components, wherein a first resistance value component of the resistance value components is independent of temperature and a second resistance value component of the resistance value components is directly proportional to temperature; and a second element having a second resistance coupled in series with the first element, wherein the second resistance substantially eliminates the first resistance value component of the first element.

7. The electric circuit of claim 6, wherein said first element includes a field-effect transistor.

8. The electric circuit of claim 7, wherein the resistance value of said resistive element is substantially half of the drain-source resistance of the field-effect transistor.

9. The electric circuit according to claim 7, wherein the field-effect transistor is a MOSFET.

* * * * *